(12) United States Patent
Shi et al.

(10) Patent No.: US 6,362,662 B1
(45) Date of Patent: Mar. 26, 2002

(54) ANALOG W.T.A. CIRCUIT REJECT SIGNAL

(75) Inventors: Bingxue Shi; Guoxing Li, both of Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/849,463

(22) Filed: May 4, 2001

(51) Int. Cl.[7] .................................................. H03K 5/22
(52) U.S. Cl. ........................................ 327/63; 327/103
(58) Field of Search ............................... 327/58–63, 69, 327/70, 71, 99, 103, 407

(56) References Cited

U.S. PATENT DOCUMENTS

| | | | | |
|---|---|---|---|---|
| 5,059,814 A | * | 10/1991 | Mead et al. ................. | 323/317 |
| 5,195,170 A | * | 3/1993 | Eberhardt .................... | 326/35 |
| 5,598,354 A | * | 1/1997 | Fang et al. .................. | 708/203 |
| 5,703,503 A | * | 12/1997 | Miyamoto et al. ............ | 327/58 |
| 5,905,387 A | * | 5/1999 | Chinosi et al. ............... | 326/35 |

\* cited by examiner

*Primary Examiner*—Kenneth B. Wells
*Assistant Examiner*—Cassandra Cox
(74) *Attorney, Agent, or Firm*—Jiawei Huang; J. C. Patents

(57) ABSTRACT

A winner-take-all (WTA) circuit apparatus for comparing two current inputs from a WTA circuit to a threshold current to create a reject signal, to assist in the decision criteria of a winner-take-all network. The circuit compares the two input currents from the WTA circuit by using NMOS transistors which perform electrical mathematical functions by manipulating the currents. The end result is that the difference of the two currents is compared with a reference current and a voltage level is outputted. The reference current is adjustable, and the invention also provides a WTA circuit with weighted inputs, and the ability to select between a 1-WTA, and a 2-WTA configuration. The invention therefore solves the problems of prior art by being capable of properly selecting current levels or rejecting current levels which are too close in value, with a voltage reject signal.

13 Claims, 2 Drawing Sheets

ANALOG W.T.A. CIRCUIT REJECT SIGNAL

BACKGROUND OF INVENTION

Field of the Invention

The present invention relates to a winner-take-all (WTA) analog circuit, and more particularly, to a reject signal for a WTA circuit.

Artificial neural networks and fuzzy logic are very effective in processing complex scientific, and engineering problems such as pattern classification since both of them are non-parametric, and need no mathematical model. Their massive parallelism, learning ability, adaptivity and fault tolerance make them more attractive in the field of pattern information processing. Although software simulations based on theory of artificial neural network, and fuzzy logic paradigms can be performed in conventional Von Neumann machines, the simulations usually take too much time for practical applications. Recently many significant advances in electronic implementation of neural networks and fuzzy logic have been achieved. Winner-take-all networks for selecting the most prominent one from N elements are central processing components in most model of neural networks such as Hamming neural network, ART (Adaptive Resonance Theory) model, SOFM (Self-organized Feature Mapping) model and fuzzy processors. It can be regarded as 1-WTA if only one prominent element is selected in one time, we call it k-WTA networks if it can select k maximum from N elements.

The WTA circuit operates by having a plurality of inputs with corresponding outputs. Using an example of a 1-WTA configuration, the circuit will select the current input that has a maximum magnitude (hence winner-take-all), and switch its corresponding output to a high voltage state. The other voltage outputs will be at a low voltage state.

In a normal k-WTA network the system will choose the most prominent element(s) of N inputs. If one of the elements is in a rising condition however it can be very difficult for the system to determine which element(s) are the most prominent. In the previous art if a WTA network is presented with two inputs that are both at similar current levels the circuit could possibly choose the wrong input as being the most prominent element or could simply reject both signals even though a definable difference exists. This limitation becomes especially important on circuits with highly varying inputs or noise.

Therefore a need exists for a k-WTA network that has the ability to correctly choose or reject two similar inputs by sending out a reject signal.

SUMMARY OF THE INVENTION

The invention as described herein provides a circuit apparatus for comparing two current inputs from a WTA circuit to a threshold current to create a reject signal if needed to assist in the decision criteria of a winner-take-all network. The threshold current is adjustable. The circuit then sends out a voltage output depending on the a comparison which can act as a reject signal. The invention also provides a WTA circuit with weighted inputs and the ability to select between a 1-WTA, and a 2-WTA configuration.

The circuit compares the two input currents from the WTA circuit by using NMOS transistors which perform electrical mathematical functions by manipulating the currents. The end result is that the difference of the two currents is compared with a reference current. The output voltage level which has two logical states is then set either high or low to indicate if the two inputs are definable or if their values are too close according to the threshold current to determine which current input is the most prominent.

The invention therefore solves the problems of prior art by being capable of properly selecting current levels or rejecting current levels which are too close in value, with a voltage reject signal. This allows for the proper decision criteria for the determination of a most prominent input.

These and other features, which characterize the invention, are set forth in the claims annexed hereto and forming a further part hereof. However, for a better understanding of the invention, and of the advantages and objectives attained through its use, reference should be made to the drawings, and to the accompanying descriptive matter, in which there is described exemplary embodiments of the invention.

DETAILED DESCRIPTION

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable those killed in the art to practice the invention, and it is to be understood that other embodiments may be utilized and that logical, changes may be made without departing from the spirit and scope of the present invention. The following detailed description is, therefore, not to be taken in a limiting sense, and the scope of the present invention is defined only by the appended claims.

Figure 1:
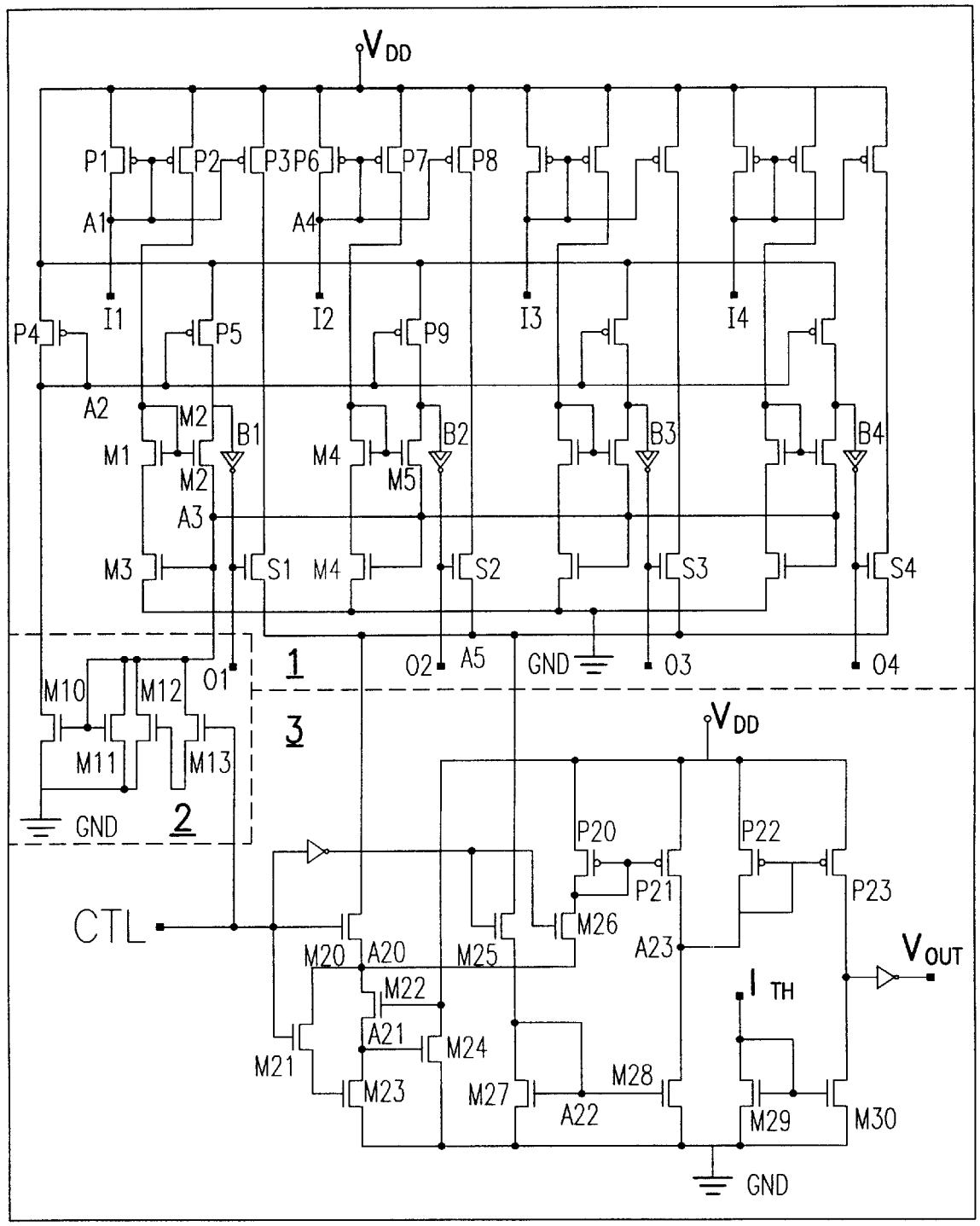
FIG. 1 is a circuit diagram of one preferred embodiment of the invention.

FIG. 1 shows an apparatus according to a preferred embodiment of the invention. For ease of description FIG. 1 has been broken into three blocks. Block 1 shows a WTA circuit with weighted inputs. Block 2 shows the current comparison circuit which is the main thrust of the invention. Block 2 shows a circuit for selecting a 1-WTA or 2-WTA configuration.

Referring to Block 1 the WTA circuit is composed of four current inputs ($I_1$–$I_4$) and four outputs ($O_1$–$O_4$). However one skilled in the art will recognize that the configuration can be used for any number of inputs and outputs. In the first stage corresponding to input $I_1$ and output $O_1$, the input is connected to node A1. Node A1 is connected to the gates of PMOS P1, P2, and P3. The drain of P1 is connected to node A1. The drain of P2 is connected to the drain of M1 and the gates of M1 and M2. The drain of P3 is connected to the drain of S1. The sources of P1, P2, P3, P4, and P5 are connected to the source voltage $V_{DD}$. The drain and gate of PMOS P4 is connected to node A2. The gate of P5 is connected to node A2. The drain of P5 is connected to B1 and the drain of NMOS M2. B1 is a current comparator for converting a current into a logical voltage level whose design is well known in the art and not disclosed in the drawing. The source of M1 is connected to the drain of M3. The source of M3 is connected to ground. The gate of M3 and the source of M2 are connected to node A3. The source of S1 is connected to node A5.

Reference will now be made to the other stages of FIG. 1 which are very similar in design, and connect $I_2$, $I_3$, and $I_4$ to their respective outputs. The input is connected to node A4. Node A4 is connected to the gates of PMOS P6, P7, and P8. The drain of P6 is connected to node A4. The drain of P7 is connected to the drain of M4 and the gates of M4 and M5. The drain of P8 is connected to the drain of S2, or S3 or S4. The sources of P6, P7, P8, and P9 are connected to the source voltage $V_{DD}$. The gate of P9 is connected to node A2. The drain of P9 is connected to B2 or B3 or B4, and the drain of NMOS M5. B2, B3, or B4 is a current comparator for converting a current into a logical voltage level whose design is well known in the art and not disclosed in the drawing. The source of M4 is connected to the drain of M6. The source of M6 is connected to ground. The gate of M6 and the source of M5 are connected to node A3. The source of S2 or S3 or S4 are connected to node A5. NMOS Transistors S1–S4 allow each input to be weighted. Typically in most applications the inputs will be weighted evenly so S1=S2=, ..., SN=1/N.

Referring to block 2 the circuit is capable of selecting the most prominent element or elements in a 1-WTA, or 2-WTA network. The circuit is capable of selecting a 1-WTA network, or a 2-WTA network configuration through the use of a CTL input. NMOS M10, M11, M12, and M13 make up a circuit that allows the device to be configured as either a 1-WTA device, or a 2-WTA device under the control of one current positive feedback loop composed of transistors M11, M2, M5 and the cascaded PMOS current mirrors. The network has the advantage of avoiding dc matching errors due to asymmetrical biasings. It is also a self bias circuit and needs no applied bias current and so the range of input currents has no limitations, therefore making it a self-adaptive WTA network. In the circuit when the CTL signal is a logical 1 (or high) the circuit is configured as 2-WTA. When the CTL signal is a logical 0 (or low) the circuit is configured as a 1-WTA. The sources of NMOS M10 M11, and M12 are connected to ground. The gates of M10 and M1, and the drains of M12 and M13 are connected to node A3. The drain of M10 is connected to node A2. The gate of NMOS M13 is connected to the CTL signal.

Referring to block 3 this circuit allows the device to consider two inputs to determine if the higher magnitude input is more prominent or if they are too close to make that determination. The most prominent element is taken from the inputs ($I_{MAX}$) and is added to the most second prominent element ($I_{SEC}$) to give a result of $I_{SUM}$. Using a current mirror a value of the value of $I_{MAX}$ is doubled to give $2I_{max}$. Then the circuit determines a value $I_{DIFF}$ which is obtained by subtracting the value of $I_{SUM}$ from $2I_{MAX}$. The process can also be performed by subtracting a second ($I_{SEC}$) current level from a first current level ($I_{MAX}$) to give a third current level ($I_{DIFF}$) which is then compared with the threshold current. The threshold current is defined by the equation:

$$I_{TH} = \sum_{i=1}^{N} S_I I_i + I_0$$

If the threshold current is greater than $I_{DIFF}$ ($I_{TH} > I_{DIFF}$) then the circuit outputs a low voltage level. If the threshold current is less than $I_{DIFF}$ ($I_{TH} < I_{DIFF}$) then the circuit outputs a high voltage level although someone skilled in the art will realize that there are many ways to output the result of the comparison.

Referring again to block 2 as stated previously a CTL input is used to configure the system as a 2-WTA with a high CTL input, and 1-WTA with a low CTL input. The CTL input is connected to the gates of NMOS M20 and M21, and after being inverted is connected to the gates of M25 and M26. The drain of M20 is connected to the source of S1. The source of M20, M26 and the drains of M21, M22 are connected to node A20. NMOS M20 can act as a storage device to store the current level of $I_{SUM}$. Connected to node A21 is the source of M22, the drain of M23 and the gate of M24. The source of M21 connects to the gate of M23. The gate of M22, the drain of M24, and the sources of P20, P21, P22, and P23 connect to $V_{DD}$. The drain of M25 connects to node A5. The source of M25 connects to node A22. Node A22 connects to the drain of M27, and the gates of M27, M28. An input threshold current $I_{TH}$ connects to the drain and gate of M29 and the gate of M30. The sources of M23, M24, M27, M28, M29, and M30 all connect to ground. The drain of M26 connects to the drain of P20 and the gates of P20, P21. The drain of P21 connects to node A23. The drains of P21 and P22 connect to node A23 as well as the gates of P22, P23. The drain of P23 connects to the drain of M30 and to an inverter for the output $V_{OUT}$.

Figure 2:
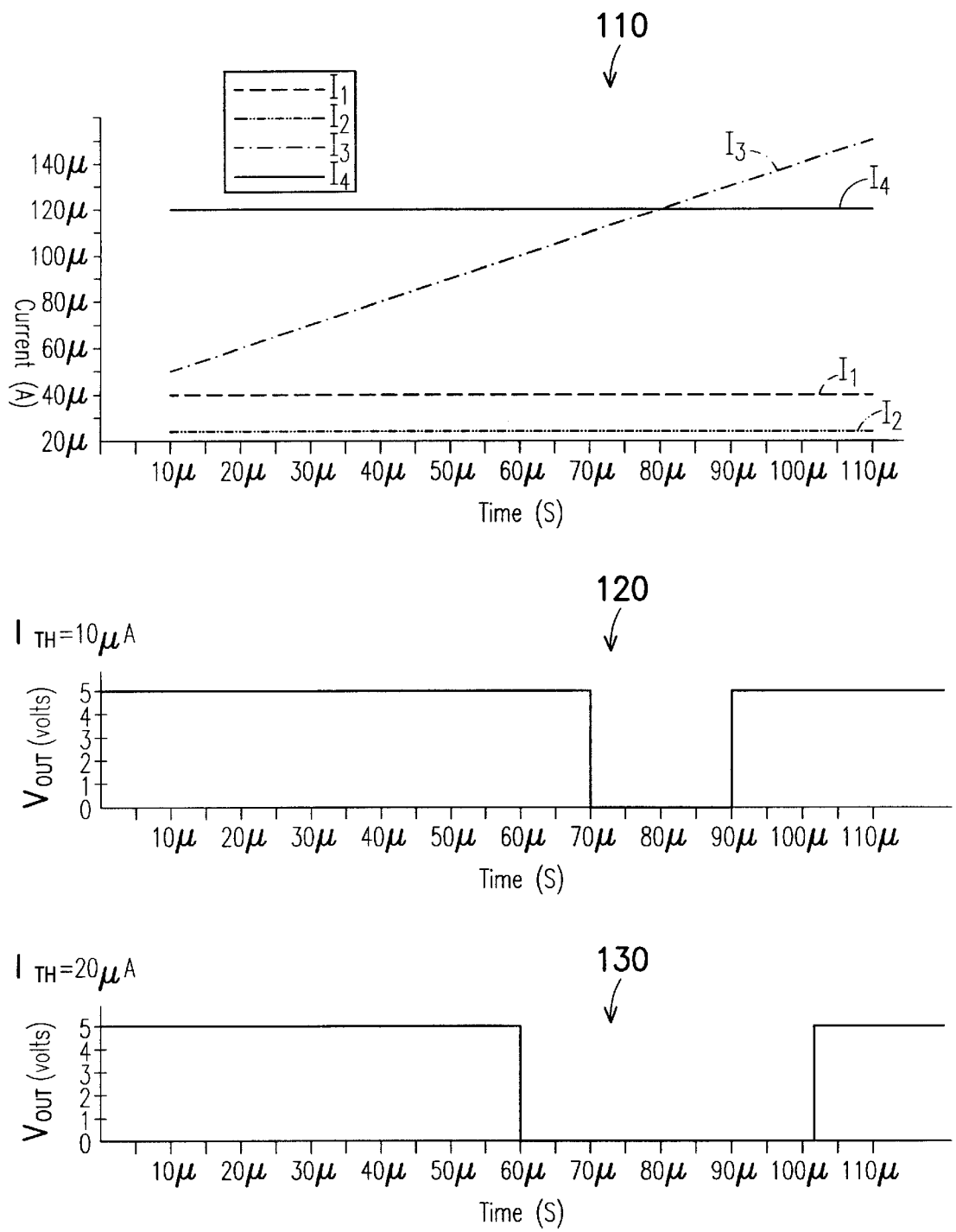
FIG. 2 is a timing diagram showing the WTA inputs and the corresponding reject voltage signal output.

FIG. 2 shows a timing diagram. Section 110 shows a set of 4 inputs where the horizontal axis represents time, and the longitudinal axis represents current. The inputs are from the WTA circuit, which has a low CTL value and is therefore configured as 1-WTA. As seen in 110 current $I_3$ is rising. Sections 120 and 130 show the output as relates to one preferred embodiment of the invention. The horizontal axis represents time, while the longitudinal axis represents voltage. Section 120 shows a voltage output when the threshold current level is set at 10 uA. Section 130 shows a voltage output when the threshold current level is set at 20 uA.

Various additional modifications may be made to the illustrated embodiments without departing from the spirit and scope of the invention. Therefore, the invention lies in the claims hereinafter appended.

What is claimed is:

1. An analog WTA circuit comprising:
   a means for determining current inputs which are most prominent; and
   a means to output a voltage level that corresponds to whether the difference between a first and second input currents is greater or less than a threshold current.

2. The analog WTA circuit of claim 1, further composing a weight-adjusting means coupled to the WTA circuit, wherein a weight factor can be applied to the inputs.

3. The analog WTA circuit of claim 1, further composing a means to select the number of prominent elements (k) that are selected by the k-WTA circuit.

4. The analog WTA circuit of claim 1, wherein the voltage level is a reject signal.

5. The analog WTA circuit of claim 1, wherein the threshold current is variable.

6. An analog WTA circuit comprising:
   a means for determining current inputs which are most prominent;
   a weight-adjusting means coupled to the WTA circuit, wherein a weight factor can be applied to the inputs;
   a means to select the number of prominent elements (k) that are selected by the k-WTA circuit; and
   a means to output a voltage level that corresponds to whether the difference between a first and second input currents is greater or less than an input threshold current.

7. The analog WTA circuit of claim 6, wherein the voltage level is a reject signal.

8. The analog WTA circuit of claim 6, wherein the input threshold current is variable.

9. An analog WTA circuit, for creating a voltage signal from outputs of a WTA circuit, the analog WTA circuit comprising:

a summing circuit configuration to add the values of a first current and a second current to create a third current level;

a storage element to store the level of the third current level;

a current multiplier to double the value of a first current to create a fourth current level;

a subtraction circuit to subtract the value of a third current level from a fourth current level to create a fifth current level;

a comparison circuit to compare the fifth current level with an inputted current level to determine a condition; and an output circuit to create a logical voltage level depending on said condition.

10. The analog WTA circuit of claim 9, wherein the logical voltage level is a reject signal.

11. The analog WTA circuit of claim 9, wherein the inputted current level is a variable threshold current level.

12. A method for obtaining an output voltage from outputs of a WTA circuit, the method comprising:

subtracting a second current level from a first current level to give a third current level;

comparing the third current level with a threshold current; and obtaining the output voltage corresponding to the comparison between the third current level and the threshold current.

13. The method of claim 12, wherein the threshold current is variable.

* * * * *